(12) United States Patent
Hwang et al.

(10) Patent No.: US 7,507,320 B2
(45) Date of Patent: Mar. 24, 2009

(54) SINGLE-ATOM TIP AND PREPARATION METHOD THEREOF

(75) Inventors: Ing-Shouh Hwang, Taipei (TW); Hong-Shi Kuo, Taipei (TW); Tien T. Tsong, Taipei (TW); Tsu-Yi Fu, Taipei (TW)

(73) Assignee: Academia Sinica, Taipei (TW)

( * ) Notice: Subject to any disclaimer, the term of this patent is extended or adjusted under 35 U.S.C. 154(b) by 428 days.

(21) Appl. No.: 10/985,717

(22) Filed: Oct. 9, 2004

(65) Prior Publication Data

US 2006/0075626 A1 Apr. 13, 2006

(51) Int. Cl.
C25D 5/34 (2006.01)
(52) U.S. Cl. .................... 205/210; 205/122; 205/135
(58) Field of Classification Search .............. 205/118, 205/134, 135, 205, 209, 210, 122
See application file for complete search history.

(56) References Cited

U.S. PATENT DOCUMENTS

| | | | | |
|---|---|---|---|---|
| 2,092,130 A | * | 9/1937 | Lyons, Jr. | 205/210 |
| 2,382,735 A | * | 8/1945 | Marks | 204/402 |
| 3,376,206 A | * | 4/1968 | Kahan et al. | 205/265 |
| 3,533,922 A | * | 10/1970 | Toledo et al. | 205/260 |
| 3,654,099 A | * | 4/1972 | Bruyne | 205/149 |
| 4,038,702 A | * | 8/1977 | Sawyer | 623/66.1 |
| 4,755,265 A | * | 7/1988 | Young | 205/234 |
| 5,126,574 A | | 6/1992 | Gallagher | |
| 5,348,638 A | * | 9/1994 | Nakagawa | 205/122 |
| 5,923,637 A | * | 7/1999 | Shimada et al. | 369/126 |
| 6,017,590 A | * | 1/2000 | Lindsay et al. | 427/430.1 |
| 6,113,451 A | | 9/2000 | Hobart et al. | |

| | | | |
|---|---|---|---|
| 2002/0005481 A1 | | 1/2002 | Williams |

FOREIGN PATENT DOCUMENTS

| | | |
|---|---|---|
| EP | 0990910 | 4/2000 |
| JP | 06181030 A * | 6/1994 |

(Continued)

OTHER PUBLICATIONS

Method of creating a Pd-covered single-atom sharp W pyramidal tip: Mechanism and energetics of its formation, Physical Review B, 64, 113401, 2001.*

(Continued)

*Primary Examiner*—Nam X Nguyen
*Assistant Examiner*—Luan V Van
(74) *Attorney, Agent, or Firm*—Venable LLP; Cameron H. Tousi; Kyle D. Petaja

(57) ABSTRACT

This invention discloses an electrochemical method for the preparation of single atom tips to replace the traditional vacuum evaporation method. The invented method for preparation of single atom tips includes the following steps: A substrate single crystal metal wire etched electrochemically to form a tip. The surface of the metal tip is cleaned. A small quantity of noble metal is plated on the apex of the tip in low concentration noble metal electrolyte. Annealing in vacuum or in inert gas ambient to diffuse the additional electroplated noble metal atoms and thus a single atom tip is formed on the surface of the substrate. The present invention also discloses the single atom tip so prepared. The single atom tip of this invention has only a very small number of atoms, usually only one atom, at its apex.

31 Claims, 3 Drawing Sheets

FOREIGN PATENT DOCUMENTS

| | | |
|---|---|---|
| WO | WO-0074107 | 12/2000 |
| WO | WO-2001/094877 | 12/2001 |

OTHER PUBLICATIONS

*Scan Probe Microscope and Spectroscopy Theory, Techniques and Applications*, pp. 165-168, 2nd Edition, edited by Dawn A. Bonnell, Wily VCH 2001.

Casella et al., *Electrochemical and Spectroscopic Characterization of Tungsten Electrode as a Sensitive Amperometric Sensor of Small Inorganic Ions*, p. 4146-4154, Electrochimica Acta 50, 2005.

*Surfaces and Interfaces of Solids*, pp. 30-31, Hans Luth, Springer-Verlag, Berlin 1993.

Rahman et al., *Electron Emission Tip at Extremely Low Bias Voltage,*, Japanese Journal of Applied Physics, vol. 45, No. 29, 2006, pp. L752-L754.

Song et al., *Faceting of W (111) Induced by Ultrathin Pd Films*, pp. 3019-3026, Langmuir 1991, 7, pp. 3019-3026, 1991 American Cancer Society.

Madey et al., *Faceting Induced by Ultrathin Metal Films: Structure, Electronic Properties and Reactivity*, Surface Science 438 (1999) pp. 191-206, 1999 Elsevier Science.

Che et al., *Faceting Induced by Ultrathin Metal Fims: A First Principles Study*, Physical Review Letters, vol. 79, No. 21, Nov. 24, 1997, pp. 4230-4233, 1997 The American Physical Society.

"Method of creating a Pd-covered single-atom sharp W pyramidal tip: Mechanism and energetics of its formation", Physical Review, Tsu-Yi Fu et al., Sep. 15, 2001, vol. 64, No. 11, pp. 113401-1, XP002439455.

* cited by examiner

SINGLE-ATOM TIP AND PREPARATION METHOD THEREOF

FIELD OF INVENTION

The present invention relates to method of preparation of single-atom tip, especially to electrochemical method of preparation of single-atom tip and the single-atom tip so prepared.

BACKGROUND OF INVENTION

The single-atom tip, with its special geometric shape and physical features, may be used as key component for advanced scientific equipments, such as scanning probe microscopy, field-emission electron microscopy, electron holography, electron energy spectroscopy, electron diffraction or interferometer, electron lithography, ion gun, low-energy electron microscopy etc. It may also be used in commercial electronic products such as flat panel display.

The term "single-atom tip" pertains to a metal tip, ending with one atom at its apex. Because there is only one atom at the apex, the single-atom tip is an ideal scanning probe. Take the scanning tunneling microscope (STM) as an example. In order to realize optimal spatial and spectral resolution, the probe of a scanning tunneling microscope must satisfy two major conditions: The tip must have an apex of one atom and the atomic structure of the tip must be known. If a single-atom tip with a known structure can have sufficient thermal and chemical stability, optimal spatial and energy resolution in the surface electronic structure may be obtained by using a scanning probe with such a metal tip.

Because its tip is terminated by one atom, the single-atom tip may serve as ideal field-emission electron source or ion source. In the application of the field-emission electron microscope, in order to improve the resolution and brightness of the electron microscope, an electron beam from a point source is necessary. An electron beam emitted from a metal tip ended with one atom has a narrow electron energy distribution. The electrons are highly coherent in phase also. The electron beam has a narrow extension angle and is thus brighter. Resolution of the microscope may thus be improved. Since the electrons are coherent, the beam can be used for electron holography to obtain the three dimensional image of a sample. The single-atom tip has a smaller onset voltage and may be used in consumer products such as field-emission flat panel display. In addition, such a metal tip may also be used in the applications of liquid metal ion source and field ionization ion source, so that optimal spatial and energy resolution of the related image may be obtained from the liquid metal ion source.

Although the single atom tip is very useful, it is difficult to prepare a single atom tip for commercial applications. In the conventional researches, several methods for preparing single atom tips were disclosed. Some used high electric field gradient to produce directional surface mobility to generate protrusion terminated with one atom. Some used high-energy electrons to heat metal tips, combined with field forming effect, to generate single atom tips. Some used field-surface-melting or ion bombardment, in combination with field evaporation and vacuum sputtering, to place a single tungsten atom on top of a small tungsten (111) facet. Although the above-mentioned methods could successfully produce a single atom tip, they need to be operated under ultra-high vacuum environment. The conventional preparation of the single atom tip is complicated and with poor yield rates. The single atom tip so prepared does not have a thermodynamically stable structure either, thus the operation lifetime is short and regeneration of single atom tips is very difficult or impossible. The metal tips so prepared don't have a well-defined structure of atoms at their apex and applications of such metal tips outside the ultra-high vacuum system are not possible. These drawbacks hinder the single atom tip from commercial applications. Such single atom tips have so far been used only in the laboratories.

Another approach to prepare single atom tips according to the conventional art includes the following steps: A tungsten tip is prepared and is cleaned by field evaporation under ultra-high vacuum. About one to two monolayers of palladium is deposited on the surface of the tungsten tip by thermal evaporation. After a 700□/3-5 minute annealing, due to the faceting of the Pd atoms covered W (111) surface, a pyramid structure is formed. This pyramid has a well-defined structure and is terminated by one atom. The most important advantage of this approach is that, when the tip is destroyed, the single atom tip can be regenerated after annealing the metal tip at 700□. This feature may satisfy the basic desirable properties of the single atom tip. A typical approach of such conventional method may be seen in Fu et al.: "Method of creating a Pd-covered single-atom sharp W pyramidal tip: mechanism and energetics of its formation", Physical Review B, 64, 113401 (2001).

Although the noble metal induced faceting is a thermodynamic process, take the example of the pyramidal structure formation induced by faceting of Pd on W (111) surface, the following conditions shall be satisfied. The W (111) surface shall be clean, containing no oxides or any other impurity atom. The Pd layer shall be close to a physical monolayer. Faceting shall be induced on the W (111) surface after being heated in the range of 780-1100 K for 3-5 minutes. In the study by Fu et al., all preparation procedures were carried out under ultra-high vacuum environment to fulfill the above requirements. This is not convenient for most applications of single-atom tips. Especially, preparation of a clean W (111) surface requires a high electric field and the deposition of Pd layer requires an evaporator.

Therefore, it is desirable to provide a novel method to fulfill the above requirements. If preparation of a clean W (111) tip surface and deposition of noble metal films on the tip can be operated under the ambient environment, one would only need to heat the tip to obtain a single-atom tip in the vacuum system that uses a single-atom tip. Annealing is a simple process and can be found in most of the systems. Therefore, commercial applications for the single atom tip will be possible.

OBJECTIVES OF THE INVENTION

The objective of this invention is to provide a simplified method for the preparation of single atom tips.

Another objective of this invention is to provide a low-cost preparation of single atom tips.

Another objective of this invention is to provide an electrochemical method for the preparation of single atom tips.

Another objective of this invention is to provide a single atom sharp tip or a metal tip terminated with a well-defined pyramidal structure using the above-said methods.

SUMMARY OF THE INVENTION

This invention discloses an electrochemical method for the preparation of single atom tips to replace the traditional vacuum evaporation method. The invented method for preparation of single atom tips includes the following steps: A substrate (111) oriented single crystal metal wire is electrochemically etched to form a tip. The surface of the metal tip is cleaned. A small quantity of noble metal is plated on the apex of the tip in low concentration of noble metal electrolyte. Annealing to diffuse the additional electroplated noble metal atoms, thus a single atom tip is formed on the surface of the substrate. The present invention also discloses the single atom tip so prepared. The metal tip prepared according to this invention has only a very small number of atoms, usually only one atom, at its apex.

These and other objectives and advantages of this invention may be clearly understood from the detailed description by referring to the following drawings.

DETAILED DESCRIPTION OF THE INVENTION

Figure 1:
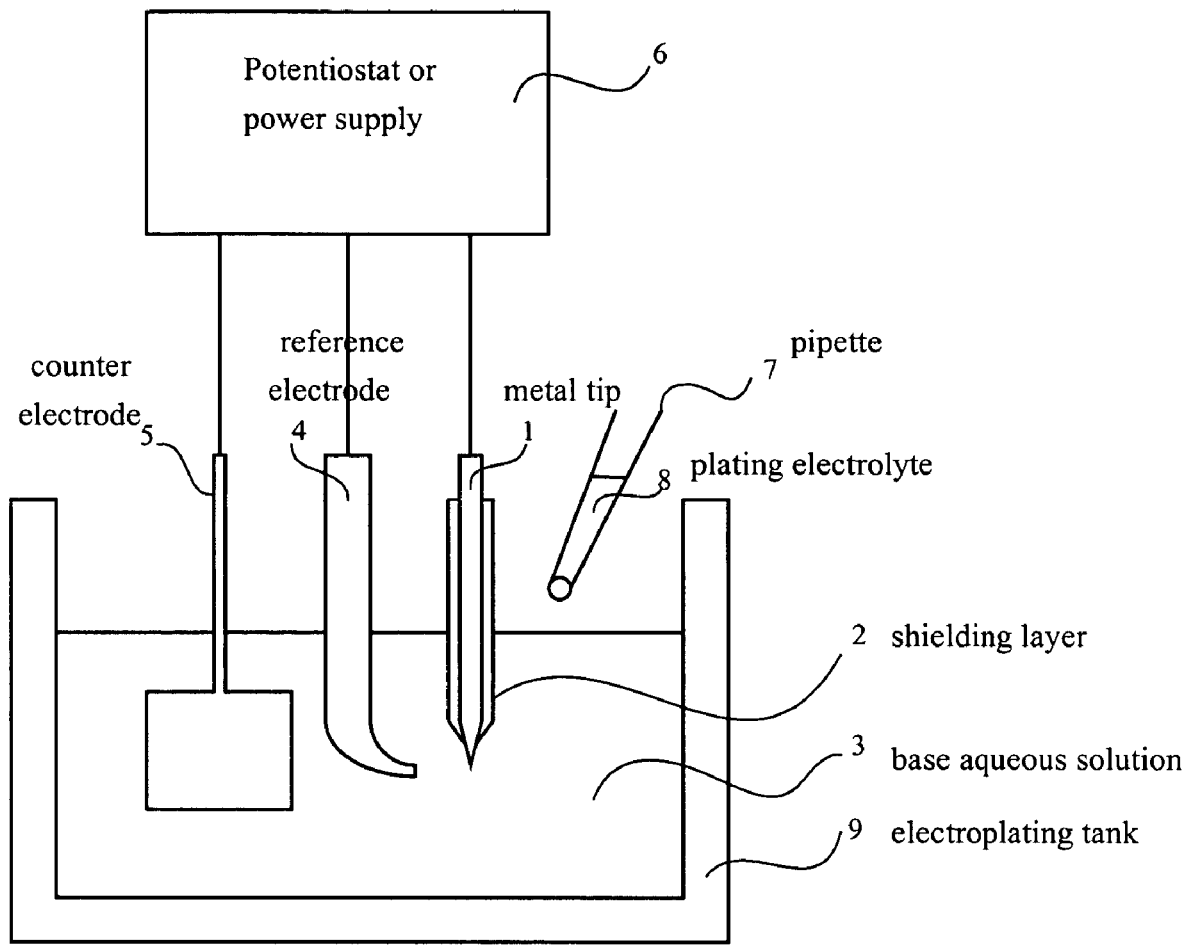
FIG. 1 illustrates the electrochemical system for the method of preparation of single atom tip of this invention.

It is well known that as an approach of industrial manufacturing, electroplating is easy, low-cost, speedy, simple and productive. If the electroplating may be used to deposit noble metal films in replacement of the traditional vacuum evaporation method, the preparation of single atom tips will be simplified and commercial applications of the single atom tip may be made possible. In addition, if a noble metal film may be plated onto the metal tip in aqueous solution, the tip so prepared may survive in the ambient environment for a sufficiently long time. A single-atom tip can be obtained simply by annealing such a tip in the vacuum system. As a result, the single atom tip may thus be applied to desired equipments or instruments for desired applications. Commercial applications for single atom tips will thus be made possible.

The invented method for preparation of single atom tips and its product will be described with the illustration of their embodiments hereinafter.

The method for preparation of single atom tips of this invention uses the electrochemical approach, which is cheaper than the traditional vacuum evaporation approach, to produce the single atom tip. The invented method comprises the following steps: A substrate metal wire is etched electrochemically to form a tip. The surface of the metal tip is cleaned. A small quantity of noble metal is plated on the apex of the tip in low concentration noble metal electrolyte. Annealing to diffuse the additional electroplated noble metal atoms and a single atom tip is formed on the surface of the substrate wire.

In the above steps, the metal wire may be made of any applicable metal or alloy material. Applicable material includes: tungsten, molybdenum or their alloys. Other metals or alloys with similar characteristics may also be used in this invention. As to the substrate of the metal tip, it is preferably a wire or a pin and is most preferably a single crystal (111) wire or pin.

In order to etch the metal wire into a tip in the electrolyte, the electrolyte is preferably a composition suited to etch the metal that consists the metal wire. In general case, the etchant may be NaOH, KOH, NH$_4$OH etc. There are no particular limitations to the concentration of the etchant. The concentration of the etchant may be from 0.1M to saturation.

In the preparation of the single atom tip of this invention, a voltage or current may be applied to assist the etching reaction, if necessary. The voltage or current may be DC or AC, while there is no particular limitation to the range or the voltage or current, as long as effective etching reaction may take place. Applicable range of current is from 1 mA to 1 A and applicable range of voltage is from 0.5 to 20 V.

The base aqueous solution as used in this invention may be any applicable combination. Applicable electrolytes include acid base aqueous solutions, basic base aqueous solutions or salt base aqueous solutions. Preparation of the base aqueous solution may include adding into water one chemical or mixing several kinds of chemicals to increase the conductivity of the water.

If the acid base aqueous solution is used, the solution may be acid aqueous solution of at least one selected from the group of hydrochloric acid, sulfuric acid, nitric acid, phosphoric acid, chloric acid etc. There is no particular limitation to the concentration of the aqueous solution, which may range from 1 mM to 2M.

If the basic base aqueous solution is used, the solution may be basic aqueous solution of at least one selected from the group of NaOH, KOH, NH$_4$OH etc. Also, there is no particular limitation to the concentration of the aqueous solution, which may range from 1 mM to 2M.

In addition, if the salt base aqueous solution is used, the solution may be aqueous solution of at least one selected from the group of chlorides such as NaCl, KCl etc., brominides such as NaBr, KBr etc., iodides such as NaI, KI etc., sulfates such as Na$_2$SO$_4$, K$_2$SO$_4$ etc., phosphates such as Na$_2$HPO$_3$ etc., nitrates such as [(NH$_4$)$_3$NO$_3$] etc., or cyanides such as NaOCN, KOCN etc. Also, there is no particular limitation to the concentration of the aqueous solution, which may range from 1 mM to 2M. If necessary, a pH buffer agent may be added into the base aqueous solution.

In the embodiment of this invention, the surface of the metal tip is cleaned by cathodic cleaning. The cathodic cleaning may also helps to reduce the oxides on the surface of the metal tip. Applicable approach includes sinking the metal tip in the base aqueous solution and applying a DC negative voltage or current to the metal tip using a power supply. In this step, there is no particular limitations to the range of current or voltage to be applied, as long as effective reduction of oxides on the surface of the metal tip may be conducted. Generally speaking, applicable ranges of the voltage and the current are from −0.4V to −5.0V and from $10^{-9}$ A to $10^{-2}$ A, respectively. In addition, a potentiostat may be used in replacement of the power supply in cathodically cleaning the metal tip. The cathodic potential may range from −0.4V to −2.0V (SCE).

The plating electrolyte shall comprise at least one noble metal compound dissolving in the liquid. Applicable approach includes adding soluble noble metal salts into water or other aqueous electrolytic liquid. Then, dissolve the noble metal salt in the liquid to obtain the plating electrolyte. Again, there is no particular limitation to the concentration of the noble metal salt to make up the plating electrolyte. In the embodimentsof this invention, the concentration can be ranged between $10^{-7}$M to $10^{-2}$M. Noble metal salt to be used includes: soluble palladium compounds, soluble platinum compounds, soluble iridium compounds, soluble rhodium compounds, soluble gold compounds or other noble metal compounds of similar substance.

For palladium compounds, applicable material includes palladium chloride, palladium sulfate, palladium nitrate, sodium palladium nitrate, palladium diamminonitrate or other applicable salts. For platinum compounds, applicable material includes platinum chloride, platinum sulfate, chloroplatinic acid, sodium chloroplatinate, sodium platinate or other applicable salts. For iridium compounds, applicable material includes iridium chloride, $(NH_4)IrCl_6$ or other applicable salts. For rhodium compounds, applicable material include rhodium chloride, rhodium nitrate, rhodium sulfate or other applicable salts. For gold compounds, applicable material includes potassium gold cyanide (PGC), gold cyanide, gold chloride or other applicable salts. Other forms of salts or similar compositions may also be applied in this invention.

Any applicable method to plate the noble metal to the metal tip may be used in this invention. For example, under the cathodic cleaning the plating electrolyte may be dropped into the base aqueous solution bath, such that the noble metal may be plated to the apex of the metal tip. In doing so, the concentration of the noble metal ion shall be maintained within a range sufficient to effectively enable the plating. In the embodiment of this invention, the concentration may be in the range of $10^{-12}M$ to $10^{-5}M$. However, this range is not a limitation to this invention. Any concentration higher or lower than such range may produce similar single atom tip structure.

When the surface of the metal tip is plated with the noble metal, thermal processing is applied to the metal tip. Applicable thermal processing includes heating the metal tip directly or indirectly, as long as a pyramid structure of noble metal may be formed on the apex of the metal tip. An applicable method is to annealing the noble metal-plated metal tip under a temperature ranging from 500☐ to 1,200 ☐. Due to the fact that such pyramid structure has excellent thermal stability, processing time of the annealing is not limited to any range, as long as a pyramid structure of the noble metal may be formed on the apex of the metal tip. The processing time may range from 30 seconds to 30 hours. It is also possible to adjust the processing temperature and the processing time according to the actual application. The thermal processing may be conducted under vacuum environment or in inert gas. Although it is possible to conduct the thermal processing under ultra-high vacuum, it is not a requirement in this invention.

If necessary, a shielding layer may be used to cover the metal tip at areas other than the apex before the cathodic cleaning, leaving the apex exposed. Applicable shielding material includes resin, such as nail polish, ethyl acetate, butyl acetate, paints, hot melt adhesive, ethylene resin, polyurethane, epoxy resin, silicone etc; oils or wax such as isolation oil, paraffin wax, Apiezon etc; or inorganic chemicals such as silicon oxide, aluminum oxide, silicon nitride, boron nitride etc. The shielding layer helps to isolate the metal tip and the electrolyte so to reduce quantity of noble metal consumed.

In addition, if necessary electrochemical annealing may be applied to the metal tip after the electroplating process, in order to shorten the time necessary in the vacuum annealing process. Applicable approach includes immersing the electroplated metal tip into the base aqueous solution, followed by applying anodic potential to the metal tip with a potentiostat. The applying anodic potential ranges from 0.2V to 0.5V (SCE). The anodic processing time is not limited to any range. In general, the anodic processing may last for from several minutes to several hours.

The metal tip so prepared has a pyramid structure at its apex, terminated by a very few small amount of atoms, usually one single atom.

The embodiments of the method for preparation of single atom tip of this invention will be described in the followings. The embodiments are given here for illustration purposes. The scope of this invention is not limited to the embodiments. An electrochemical system as shown in FIG. 1 is organized. FIG. 1 shows an electrochemical system applicable in this invention. As shown in this figure, the electrochemical system to prepare a single atom tip comprises: a metal tip 1 with a shielding layer 2, base aqueous solution 3, reference electrode 4, counter electrode 5, potentiostat or power supply 6, pipette 7, plating electrolyte 8, and electroplating tank 9. All these components or materials are commercially available in the market. Those skilled in the art may easily organize such an electrochemical system with reference to the above description and the drawing.

EMBODIMENT I

Figure 2:
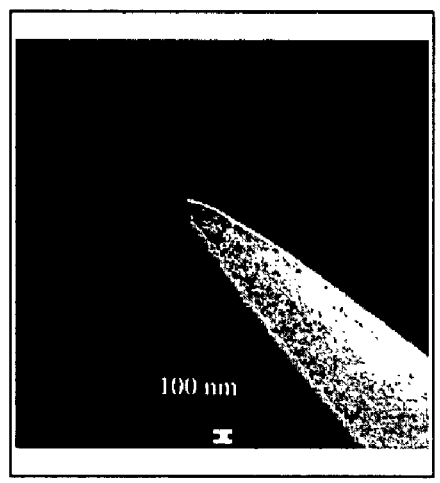
FIG. 2 is an SEM photo showing the apex of a metal tip after electrochemical etching.

Etching: A tungsten single crystal <111> wire is electrochemically etched into a tungsten tip. The metal tip is cleansed in water. The apex of the etched metal tip, as well as its size, is shown in FIG. 2.

Shielding: The metal tip is shielded with nail polish as shielding layer, at areas other than the apex, such that only the apex of the metal tip is exposed.

Electrochemical system: In the system as shown in FIG. 1, the metal tip is immersed into the base aqueous solution. A saturated calomel electrode (SCE) is used as reference electrode, platinum electrode as counter electrode, and an EG&G 366A potentiostat as power supply. Proper quantity of palladium electrolyte in the pipette is prepared.

Cathodic cleaning: When the metal tip is positioned in the base aqueous solution (0.1M HCl), −0.6V (vs. SCE) is applied to cathodic process the metal tip for 10 minutes.

Plating: Drop the palladium-plating electrolyte (0.1 mM $PdCl_2$+0.1M HCl) into the base aqueous solution, maintaining the concentration of palladium ion at around $1\times10^{-7}M$. Plate the metal tip under −0.6V (vs. SCE) for 10 to 15 seconds.

Annealing: After the plating, the metal tip is cleansed with water and acetone. The metal tip is annealed in vacuum chamber under 700☐ for over 30 minutes.

Observation: The atomic structure at the apex of the metal tip is observed with a homemade field ion microscope. The result is shown in FIGS. 3a to 3c.

Figure 3:
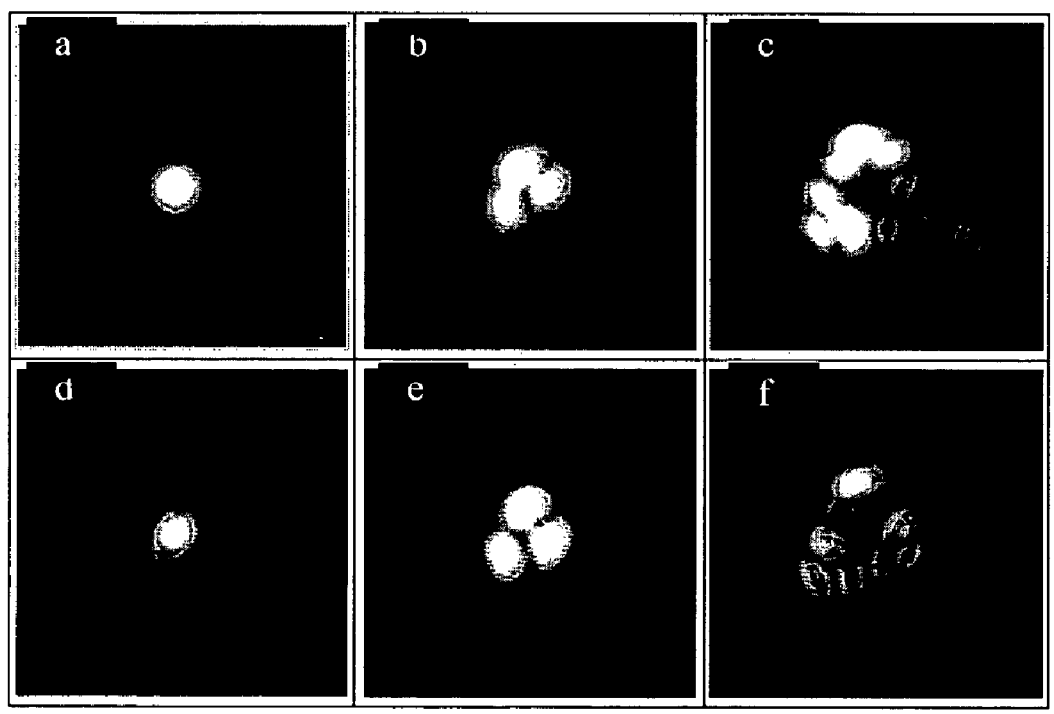
FIG. 3 shows the FIM photo of the single atom tip of Embodiment I.

As shown in FIG. 3a, at the apex of the metal tip only one single palladium atom is positioned. It is proved that the tungsten tip after the above processing is a single atom tip. Field evaporation is applied to the metal tip to remove the top layer atom to observe the second layer. It is found that the second layer of the apex consists of 3 atoms, as shown in FIG. 3b. The second layer is then removed with field evaporation. Observation of the apex of the metal tip reveals that the third layer consists of 9 atoms. Note that the bottom-right atom of this layer is removed during the field evaporation. It may be concluded that the third layer consists of 10 atoms.

From the above observation, it has been found that the apex of the invented metal tip has a three-sided pyramid with (211) facets. When the pyramid structure is destroyed by field evaporation, a new pyramid structure may be regenerated after being annealed under 700☐ for 5 minutes, as shown in FIGS. 3d-3f. The regenerated pyramid structure does not only resume the single atom apex but also maintains the atomic stacking structure, i.e. one atom in the top layer, 3 atoms in the second layer and 10 atoms in the third layer. The electrochemical approach of this invention produces the same pyramid structure and the atomic faceting as in the conventional vacuum evaporation approach. The regeneration of the pyramid structure may be repeated for tens of times.

In addition, this embodiment shows that the palladium-plated W (111) tip of this invention has perfect chemical stability. It survives in the ambient environment and is resilient to aqueous cleansing. The single atom tip can be easily generated by annealing the palladium-plated W (111) tip in the desired vacuum system and thus be useful for many applications.

EMBODIMENT II

Figure 4:
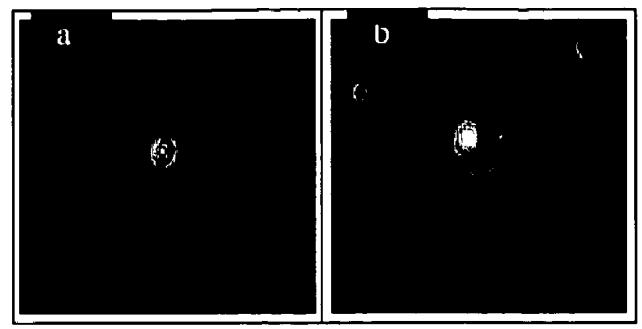
FIG. 4 shows the FIM photo of the single atom tip of Embodiment II.

In an electrochemical system same as that of Embodiment I, tungsten tip is plated and annealed according to the same process of Embodiment I, except that the shielding of the metal tip is omitted and that the tungsten tip is plated in a concentration of palladium ion of $3\times10^{-7}$M with −0.6V (vs. SCE) for 15 seconds. The plated metal tip is further annealed in vacuum chamber at 700□ for 20 minutes and then at 500□ for over 17 hours, followed by annealing at 700□ for 5 min. An atomic level facet pyramid structure on W (111) surface is observed, as shown in FIG. 4.

In comparison to Embodiment I, in Embodiment II the concentration of the palladium electrolyte is increased and the shielding process is omitted, so that more palladium is plated to the tungsten tip. In addition, the annealing temperature is lowered and the annealing time is extended so that possible range of conditions in forming the pyramid structure may be realized. As shown in FIG. 4a, the topmost layer of the pyramid structure contains only one atom. The single atom structure of the metal tip is proven. The second layer has 3 atoms, as shown in FIG. 4b, which is the same as that of Embodiment I, as shown in FIG. 3b. In addition, FIG. 4b shows several atoms positioned at the crest lines of the pyramid structure. Thus it is proved that single atom tips may be prepared under the operational conditions of Embodiment II. In addition, in this embodiment the single atom tip exhibits excellent thermal stability. Even if the single atom tip is heated for a relative long time, the pyramidal single atom tip structure is not damaged.

EMBODIMENT III

Figure 5:
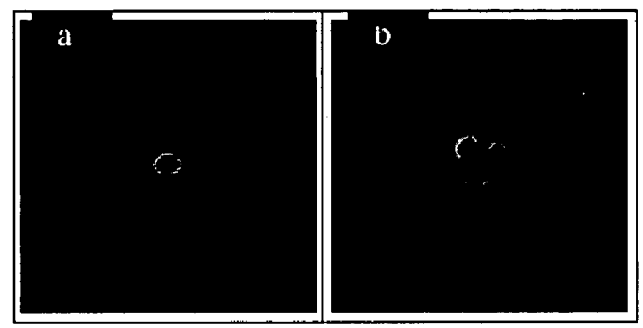
FIG. 5 shows the FIM photo of the single atom tip of Embodiment III.

In an electrochemical system as Embodiment I, a metal tip is plated and annealed according to the same process of Embodiment I, except that the plated metal tip is first sunk into the base aqueous solution to be electrochemically annealed under +0.4V (vs. SCE) for 15 minutes and the shielding nail polish is then removed with acetone before it is annealed in the vacuum chamber under 700□ for 5 minutes. The finished metal tip is observed and a facet atomic level pyramid structure on the W (111) surface is found, as shown in FIGS. 5a and 5b.

If compared with Embodiment I, in Embodiment III an electrochemical annealing process is added to shorten its anneal time in the vacuum chamber. FIG. 5a shows that the topmost layer of the apex has only one atom, meaning that the metal tip so prepared is a single atom tip. When the topmost atom is evaporated, 3 atoms in the second layer are observed, as shown in FIG. 5b. Thus, it is shown that the same pyramid structure is formed at the apex of the metal tip under the operation of Embodiment III. The stacking structure of the atomic layers is the same as that of Embodiment I.

EMBODIMENT IV

Figure 6:
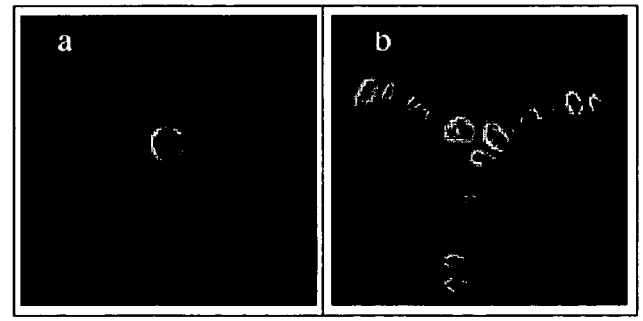
FIG. 6 shows the FIM photo of the single atom tip of Embodiment IV.

In an electrochemical system same as in Embodiment I, a metal tip is plated and annealed according to the process of Embodiment III, except that platinum electrolyte is used to replace the palladium electrolyte of Embodiment III. The platinum-plating electrolyte (0.01 mM $PtCl_2$+0.1M HCl) is dropped into the base aqueous solution from a pipette to make the concentration of platinum ion $1.5\times10^{-8}$M and the metal tip is plated under −0.6V (vs. SCE) for 10 seconds. Observe the stacking structure of the apex with a field ion microscope (FIM). It is found that under the above operation, the platinum-plated W (111) tip facets to form an atomic level pyramid structure on the W (111) surface, as shown in FIGS. 6a and 6b.

In this embodiment, platinum electrolyte of a lower concentration is used in replacement of the palladium electrolyte of Embodiment III, to plate platinum on the tungsten tip. FIG. 6a shows one extruded atom at top of the pyramid structure. The metal tip so prepared is a single atom tip. Remove the topmost platinum atom with field evaporation and 3 platinum atoms in the second layer are seen, as shown in FIG. 6b. In addition, FIG. 6b also shows the whole picture of the three crest lines of the nano pyramid structure at the apex of the metal tip. It is shown that the pyramid structure consists of at least 8 layers of platinum atoms. This embodiment shows that not only electroplated palladium but also electroplated platinum may be used to induce surface faceting at the apex of the W (111) tip, so to form a pyramid structure. In other words, the method of this invention may be used to induce pyramidal faceting of plating layers of other noble metals on W (111), in addition to palladium.

As described above, this invention is useful in forming a pyramid structure that is terminated by a very small number of atoms, usually one single atom, on the apex of a metal tip. Although the present invention is illustrated by the above embodiments, it is not limited to the embodiments. For example, in the embodiments metal tips terminated by one single atom are shown. However, even if the number of atom in the topmost layer is greater than one, the metal tip so prepared is of commercial and scientific values. In addition, materials for the substrate of the metal tip, the noble metal electroplating layer and the electrolyte are not limited to those shown in the embodiments. Anyone skilled in the art may make variations and modifications to these embodiments without escaping from the spirit and scope of this invention. This invention may only be limited by the following claims.

What is claimed is:

1. A method for preparation of a metal tip terminated by a small number of atoms, comprising the following steps:
    inserting a metal tip of a metal wire in an etchant liquid to form a tip shape in said metal wire;
    cleaning said metal tip in a base aqueous liquid via cathodic polarization such that substantially any oxide present on said metal tip is removed;
    dissolving a quantity of noble metal plating electrolyte in said base aqueous liquid;
    electroplating, on said metal tip, a film of noble metal from said base aqueous liquid, wherein said metal tip remains in the base aqueous liquid during said cleaning and said electroplating such that the oxide is prevented from forming again on said metal tip and
    thermal processing said plated metal tip to form a pyramidal structure terminated by a small number of noble metal atoms on apex of said metal tip.

2. The method according to claim 1, wherein material of said metal tip is selected from the group consisted of tungsten, molybdenum or their alloy.

3. The method according to claim 2, wherein material of said metal tip is single-crystal <111> wire.

4. The method according to claim 1, wherein said etchant liquid comprises NaOH, KOH or $NH_4OH$ base aqueous solution, with a concentration from 0.1 M to saturation.

5. The method according to claim 4, further comprising a step of applying a voltage or a current to said etchant liquid during etching, wherein said voltage or current is supplied by a DC power supply or an AC power supply.

6. The method according to claim 1, wherein said base aqueous solution is an acid base aqueous solution comprising one or more selected from the group of hydrochloric acid, sulfuric acid, nitric acid, phosphoric acid and chloric acid.

7. The method according to claim 1, wherein said base aqueous solution is a basic base aqueous solution comprising one or more selected from the group of NaOH, KOH and $NH_4OH$.

8. The method according to claim 1, wherein said base aqueous solution is a salt base aqueous solution comprising one or more selected from the group of NaCl, KCl, NaBr, KBr, NaI, KI, $Na_2SO_4$, $K_2SO_4$, $Na_2HPO_3$, $(NH_4)_3NO_3$, NaOCN and KOCN.

9. The method according to claim 1, wherein said base aqueous solution further comprises an acid buffer agent or a basic buffer agent.

10. The method according to claim 1, wherein said cathodic polarization comprises applying a cathodic potential on said metal tip in said base aqueous solution using a potentiostat.

11. The method according to claim 1, wherein said cathodic polarization comprises applying a negative voltage or negative current to said metal tip in said base aqueous solution using a power supply.

12. The method according to claim 1, wherein said noble metal is selected from palladium, platinum, iridium, rhodium, gold or their alloy.

13. The method according to claim 1, wherein said plating electrolyte is an aqueous electrolytic liquid containing soluble noble metal salt.

14. The method according to claim 13, wherein concentration of said noble metal salt is above $10^{-7}$ M.

15. The method according to claim 13, wherein said noble metal salt comprises a soluble palladium compound selected from the group of palladium chloride, palladium sulfate, palladium nitrate, sodium palladium nitrate and palladium diamminonitrate.

16. The method according to claim 13, wherein said noble metal salt comprises a soluble platinum compound selected from the group of platinum chloride, platinum sulfate, chloroplatinic acid, sodium chloroplatinate and sodium platinate.

17. The method according to claim 13, wherein said noble metal salt comprises a soluble iridium compound selected from the group of iridium chloride and $(NH_4)IrCl6$.

18. The method according to claim 13, wherein said noble metal salt comprises a soluble rhodium compound selected from the group of rhodium chloride, rhodium nitrate and rhodium sulfate.

19. The method according to claim 13, wherein said noble metal salt comprises a soluble gold compound selected from the group of potassium gold cyanide (PGC), gold cyanide and gold chloride.

20. The method according to claim 13, wherein concentration of said noble metal salt in said base aqueous solution is maintained in the range from $10^{-12}$M to $10^{-5}$M, obtained by dropping said plating electrolyte in said base aqueous solution.

21. The method according to claim 1, wherein said plated metal tip comprises metal tip electroplated with said noble metal on its surface.

22. The method according to claim 1, wherein said thermal processing comprises annealing said plated metal tip.

23. The method according to claim 22, wherein said annealing is conducted under 500 to 1,200 degrees Celsius for 30 seconds to 30 hours.

24. The method according to claim 22, wherein said annealing is conducted in vacuum or in inert gas.

25. The method according to claim 1, wherein said metal tip is coated with a shielding layer at areas other than its apex region before said.

26. The method according to claim 25, wherein said shielding layer comprises a material selected from nail polish, acetate, paintsparaffin wax, Apiezon wax.

27. method according to claim 1, further comprising a step of applying anodic potentials on said plated metal tip in said base aqueous solution using a potentiostat.

28. The method according to claim 10, wherein said applied cathodic potential is below-0.4 V (SCE).

29. The method according to claim 11, wherein said negative voltage is below -0.4 V.

30. The method according to claim 11, wherein said negative current is greater than 1 nA.

31. The method according to claim 27, wherein said anodic potentials are above 0.2 V (SCE).

* * * * *